(12) United States Patent
Fein et al.

(10) Patent No.: US 7,884,714 B2
(45) Date of Patent: Feb. 8, 2011

(54) SYSTEM AND METHOD FOR ALTERING SETTINGS ON ELECTRONIC DEVICES BASED UPON SENSING STIMULI

(75) Inventors: Gene S. Fein, Lenox, MA (US); Edward Merritt, Lenox, MA (US)

(73) Assignee: Voorhuis PLC, Limited Liability Company, Wilmington, DE (US)

( * ) Notice: Subject to any disclaimer, the term of this patent is extended or adjusted under 35 U.S.C. 154(b) by 190 days.

(21) Appl. No.: 11/620,352

(22) Filed: Jan. 5, 2007

(65) Prior Publication Data

US 2008/0167867 A1 Jul. 10, 2008

(51) Int. Cl.
*G08B 1/08* (2006.01)
(52) U.S. Cl. .................. 340/539.22; 704/231; 340/517; 340/539.11; 340/539.25
(58) Field of Classification Search ................. 704/231; 340/870.16, 505, 539.11, 565, 10.1, 870.09; 455/345; 700/84
See application file for complete search history.

(56) References Cited

U.S. PATENT DOCUMENTS

| | | | | |
|---|---|---|---|---|
| 4,952,931 A * | 8/1990 | Serageldin et al. | ........... | 340/902 |
| 5,594,471 A * | 1/1997 | Deeran et al. | ................ | 345/173 |
| 7,317,909 B2 * | 1/2008 | Chun | ...................... | 455/414.1 |
| 7,427,921 B2 * | 9/2008 | Van Woudenberg | ...... | 340/573.1 |
| 2002/0080032 A1 * | 6/2002 | Smith et al. | .............. | 340/572.1 |
| 2005/0254505 A1 * | 11/2005 | Chang et al. | ................ | 370/401 |
| 2007/0003094 A1 * | 1/2007 | Chen | ........................... | 381/381 |
| 2007/0189544 A1 * | 8/2007 | Rosenberg | .................... | 381/57 |
| 2007/0285234 A1 * | 12/2007 | Hovmalm et al. | ........... | 340/566 |
| 2008/0068155 A1 * | 3/2008 | Noel | ..................... | 340/539.15 |
| 2008/0136623 A1 * | 6/2008 | Calvarese | ............. | 340/539.11 |

OTHER PUBLICATIONS

U.S. Appl. No. 60/841,990; Rosenberg, Louis (Inventor); Aug. 31, 2006; Specification.*
U.S. Appl. No. 60/841,990; Rosenberg, Louis (Inventor); Aug. 31, 2006; Drawings.*
U.S. Appl. No. 11/622,630, by Gene S. Fein and Edward Merritt, filed Jan. 12, 2007.

* cited by examiner

*Primary Examiner*—Daniel Wu
*Assistant Examiner*—Rufus Point
(74) *Attorney, Agent, or Firm*—Stolowitz Ford Cowger LLP

(57) ABSTRACT

Disclosed is a method and system for altering settings on portable electronic devices based upon the surrounding sounds. The system and method create a series of improvements in electronic devices that enable a person to have a greater possibility to hear their name being called, important signals or emergency vehicles while using their electronic devices are in use by the instant user. An example embodiment (i) provides at least one sensor connected to a portable device, each sensor detecting surrounding sounds; (ii) recognizing a specific sound among the surrounding sounds by the at least one sensor by matching the specific sound to one of a plurality of reference sounds; and (iii) altering settings of the portable device from a first setting to a second setting, in a first event the specific sound matches with one of the plurality of reference sounds.

26 Claims, 9 Drawing Sheets

SYSTEM AND METHOD FOR ALTERING SETTINGS ON ELECTRONIC DEVICES BASED UPON SENSING STIMULI

BACKGROUND OF THE INVENTION

It is well known that communication problems can occur when an individual is in the process of utilizing an electronic device, whether that device is a cell phone or a portable media player, certain problems in communication can arise. One such problem is that when a persons name is called while that person is using an electronic device, many times they do not hear their name being called. The same scenario is true of a person who may not have the ability to hear an emergency siren because they are listening to an electronic device, either using headphones or simply held to the ear.

Currently, electronic devices can be turned down manually if the user or someone nearby the user accesses the controls to the device or removes the headphones or device from the user's ear. Some devices may also respond to voice activated controls of the settings from the user to make adjustments to the specific controls of the device.

Conventional models have devices with noise limiters or maximum volume controls installed inside the devices. Devices may also have voice activated controls over settings such as volume or content selection. Manual operation of settings is still the most common way that volume control is adjusted.

Unfortunately, these controls do not address the problem that is encountered when someone using an electronic device has the volume raised to a level that they cannot hear their name being called, important announcements or emergency vehicles or warning bells.

Accordingly, the present invention creates a series of improvements in electronic devices that enable a person to have a greater possibility to hear their name being called, important signals or emergency vehicles while using their electronic devices.

SUMMARY OF THE INVENTION

The present invention relates to the ability to change the setting of an electronic device based upon the electronic sensing of certain stimuli or conditions by that device or a networked companion device.

In a preferred embodiment is a method and system that (i) provides at least one sensor connected to a portable device, each sensor detecting surrounding sounds; (ii) recognizing a specific sound among the surrounding sounds by the at least one sensor by matching the specific sound to one of a plurality of reference sounds; and (iii) altering settings of the portable device from a first setting to a second setting, in a first event the specific sound matches with one of the plurality of reference sounds.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Figure 1:
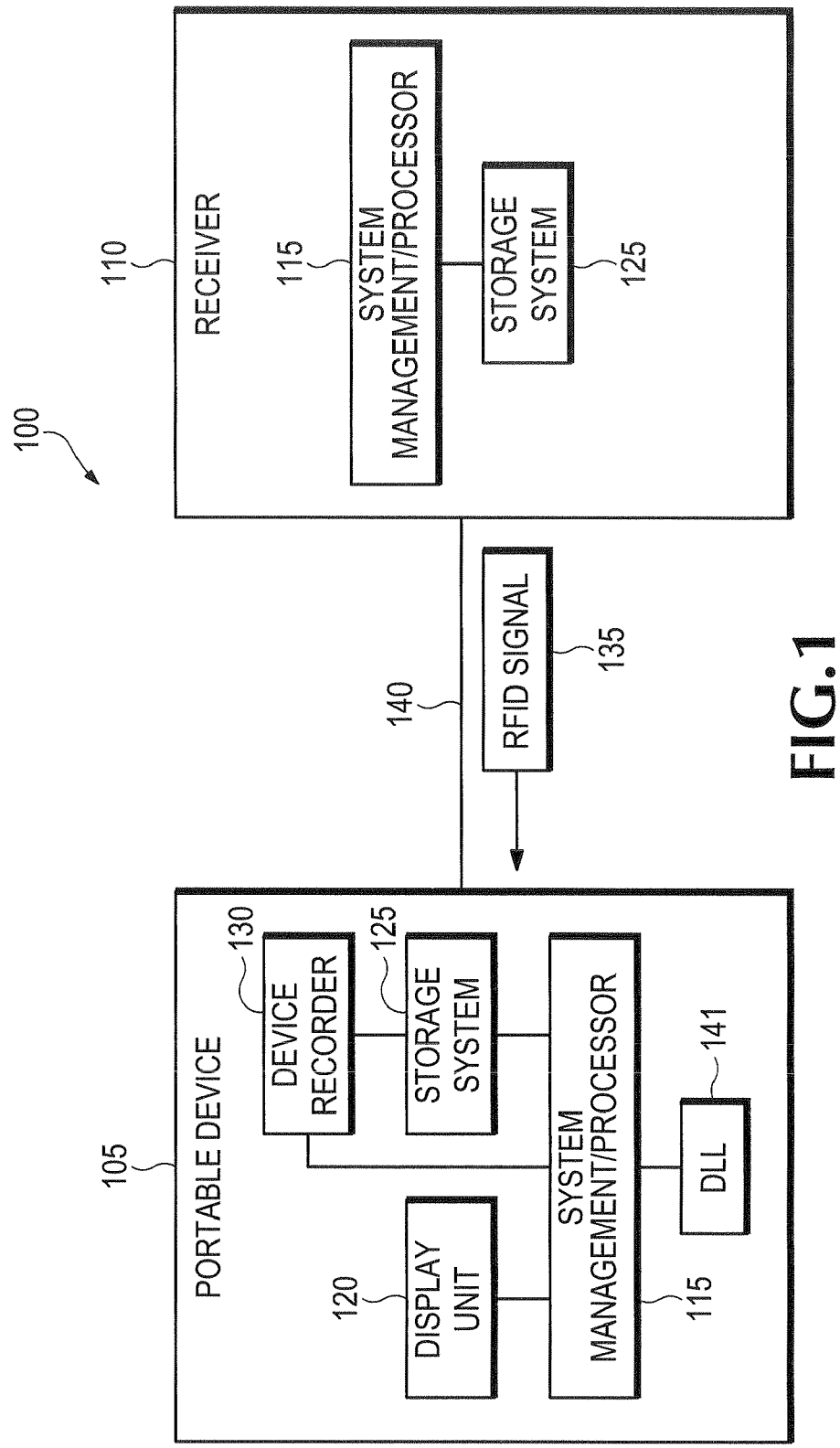
FIG. 1 is a block diagram of an exemplary architecture of a system embodying the present invention.

FIG. 1 illustrates the architecture of the system 100 employing an embodiment of the present invention for automatically altering settings on electronic devices upon sensing the surrounding sounds. The system 100 may include a receiver 110 and a portable device 105. The system 100 may alter the settings of the portable device 105, for example, by creating a volume or video limiter. The portable device 105 may be a cell phone or any other type of digital music players, such as an iPod. The receiver 110 may include a processor 115 and a storage system 125. The storage system 125 may be a non-volatile flash memory. The receiver 110 may be connected to the portable device 105 via a connection line 140 or a wireless connection (not shown). The receiver 110 is configured to sense surrounding sounds within the vicinity of the receiver 110. The processor 115 may detect or recognize specific audio sound from the surrounding environment to sounds that are stored on the storage system 125. The receiver 110 may be deployed as part of the portable device 105.

The portable device 105 may include a device recorder 130, such as a microphone 605 (FIG. 6), a system management/processor 115 having software programs that decipher specific sounds among the surrounding sounds of the receiver 110 by waveform analysis or via traditional voice activation matching techniques where certain surround sounds, such as emergency sirens are pre-loaded into the device software program via locally cached storage system 125. Other sounds such as the user's name, children's voices, children crying, etc. can be manually loaded by the user into the system 100 via the device recorder 130.

By utilizing a waveform matching database to identify sounds, the device recorder 130, such as a microphone 605 (FIG. 6), passes all sounds to a waveform database (storage system 125) cached within access to a media layer 105 and developed according to the media players Application Programming Interface Guide (API). When the media player 105, or other voice recognition application, such as one by Dragon Systems, plays a matching sound that is passed to and matched in the database (storage system 125) by voice activation or waveform analysis, the system management/processor 115 may then electronically signal the portable device 105 through a programming gateway in the device hardware API that results in the volume control message being sent and receiving a message to mute the volume for a specified period of time. This specified period of time can be set for until the user manually raises the volume, or any other increment of time that the portable device 105 may be set to.

Data from the surrounding sound external to the receiver 110 is ultimately processed by an application designed to call out functions that may cause the portable device 105 to alter its settings. It will be understood by those skilled in the art that there are many functions to call resulting in the portable device to alter its settings. In one embodiment of the present invention, such specialized functions may be dynamic link libraries (DLLs) 141. For example, a DLL may tag a sound so that the portable device 105 alters its settings. There may be numerous tags, each tag being associated with a particular reference sound stored on the storage system 125. For example, the DLL tags a siren sound to cause the portable device to mute the volume. Moreover, there may be numerous DLLs, each having a different technique or means for altering the portable device 105 settings.

Dynamically linked libraries 141 may be originally created using an editor from any standard or proprietary computer language, such as, for example, C#, JAVA, JavaScript, JScript, C++, Visual Basic, VB. NET, etc. After the libraries are written, they are compiled into application project files, within the DLL 141, which are then linked with the system management/processor 115. The steps of writing and compiling dynamically linked libraries generally happen offline, before the execution of the system management/processor. In an alternative embodiment of the invention, additional dynamically linked libraries may be added during the execution of the system 100, as deemed necessary by one of skill in the art.

For a portable device 105, such as an iPod, which one does not think of as a device that can readily accept outside media instructions, this invention may also be valid. The iPod has been shown in practice via the Nike iPod to be able to feed, register and display externally sensed data with its iPod Nike hardware and software application which broadcasts a runner's real time progress to the user of the device via traditional audio or video programming being interrupted. This concept is applied wholly with this invention except it is applied for the sensing and recognition of certain sounds via voice recognition system, which can be applied internally and or externally to the device 105, such as the iPod, to facilitate the safety, warning or increase external communication for the user. This external sensor system 100 may utilize radio frequency identification (RFID) exchanges between or one way sending from the receiver 110 to the portable device 105 that are then registered as data points via the RFID reader. The RFID reader data is converted to actual user readable data via the use of a database 125 being cached inside the portable device 105 for matching purposes. The co-owned patent application entitled "System and Method for RFID Voice Signature" by Gene S. Fein and Edward Merritt discloses methods for utilizing RFID exchanges. Other RFID data techniques are also suitable for the present invention. A display unit 120 displays the user readable data and other visual indicators of the operation of device 105 as will become clear later.

The surrounding sounds sensed by the receiver 110 and voice/audio matching software are reduced to a RFID signal 135 that is sent to the portable device 105 once it registers a "match" of sounds that are set to activate the volume mute or volume limiting function. This is similar to how the iPod Nike model functions. Also, the iPod has been shown to be able to be hacked to be able to interface with the linux operating systems and run different applications on the linux-hacked iPod, some of these related hacks can be found at www.i-podlinux.org. This is analogous to running the audio matching and volume limiting software and menu display. These settings may also be refined to add entertainment value to the device by adding commands such as, raising the volume when one hear a specific person's voice, someone calling one's name, a dog barking or airplane noise. The portable device 105 may also be set to play a specific song or video selection based upon the sensing of a specific noise. The specific noise may be the sounds that are stored in the storage system 125.

Figure 2:
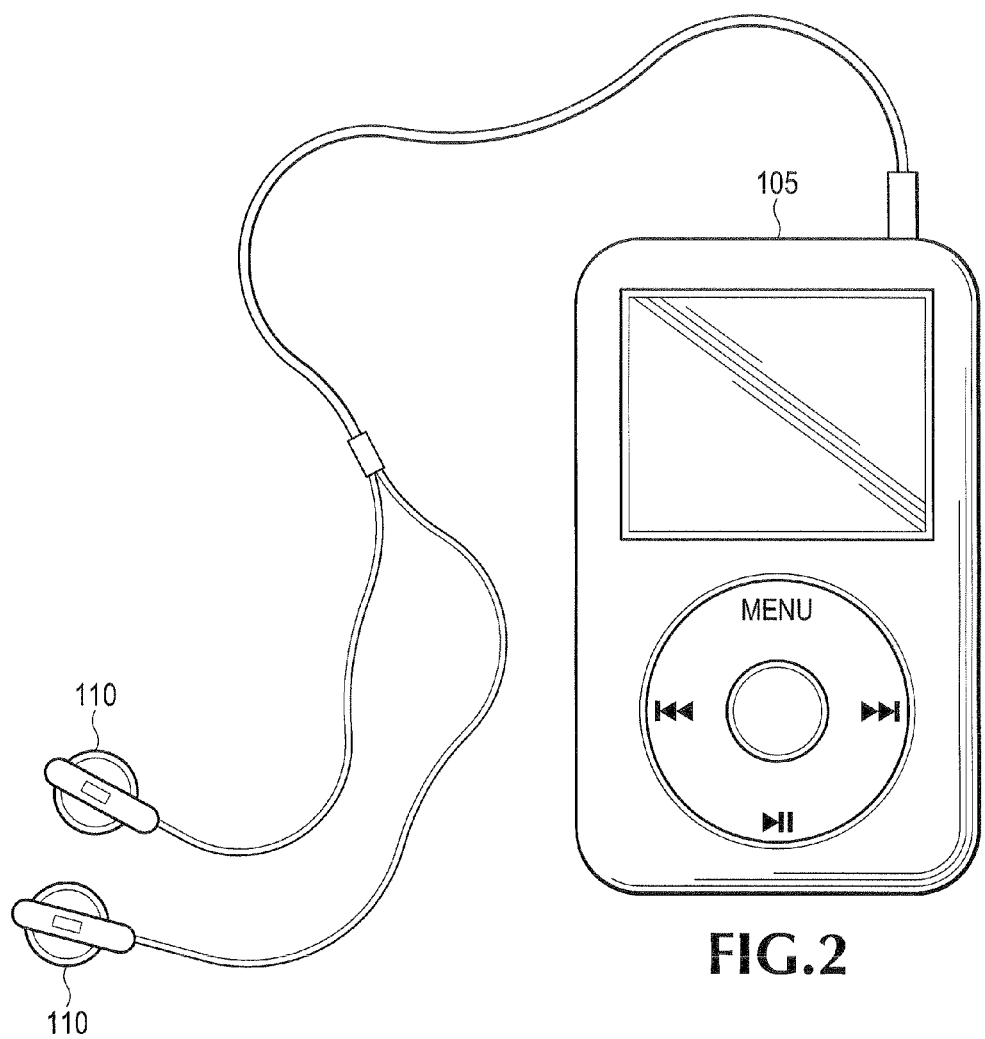
FIG. 2 illustrates a portable device of the present invention with head phone sensor.

FIG. 2 illustrates a rendering of a portable device 105, such as an iPod, employing an embodiment of the present invention that produces audio. The portable device 105 is shown with a set of receivers 110, such as earphones, to detect audio signals from the surrounding environment and may send them back to the portable device 105 for verification of a match or to make the match at the locally cached database 125 within the receivers 110. If a match is found then the portable device 105 may, for example, limit the volume for a certain amount of time based upon default or custom user setting.

Figure 3:
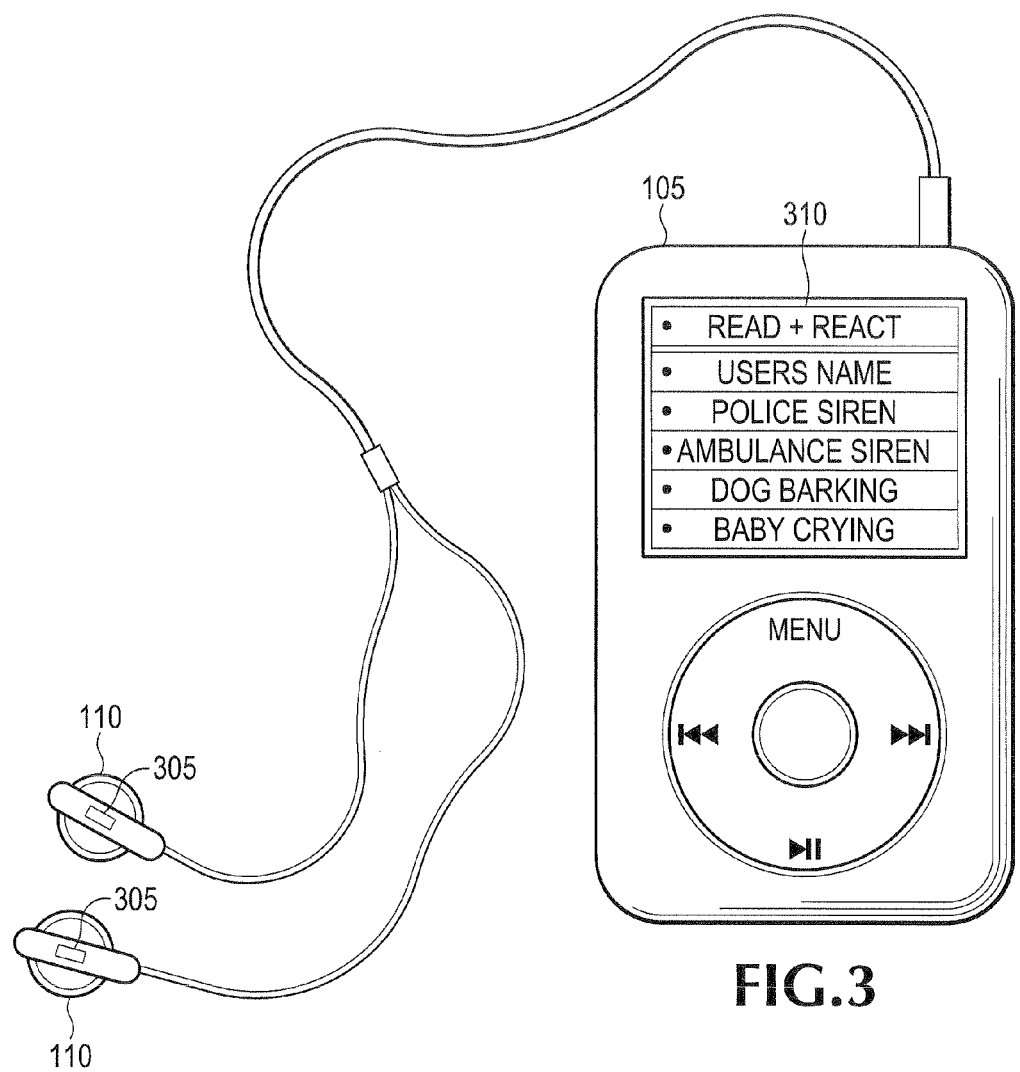
FIG. 3 illustrates a portable device of the present invention with head phone sensor set to 'read and react' to sounds.

FIG. 3 illustrates a rendering of an electronic device 105 employing an embodiment of the present invention that produces audio. The iPod 105 is shown with a set of receivers 110, such as earphones, that are equipped with sensors 305 to gather in the surrounding sounds and send them back to the portable device 105 for verification of a match. If a match is found then the portable device 105 may limit the volume for a certain amount of time based upon default or custom user setting. The sensed surrounding sounds that activate the volume limiter force the volume limiter menu 310 to appear on the screen (display unit 120) as part of the volume limiter interface. The volume menu 310 may include an indication of the specific sound that was detected by the receivers 110/sensors 305. The indication may be user's name, police siren, ambulance siren, dog barking, baby crying, and other types of sounds. The indication may be in textual or graphical format on the portable device. These indications of specific sound may be a default setting by the manufacturers or may be set and adjusted by the user.

Figure 4:
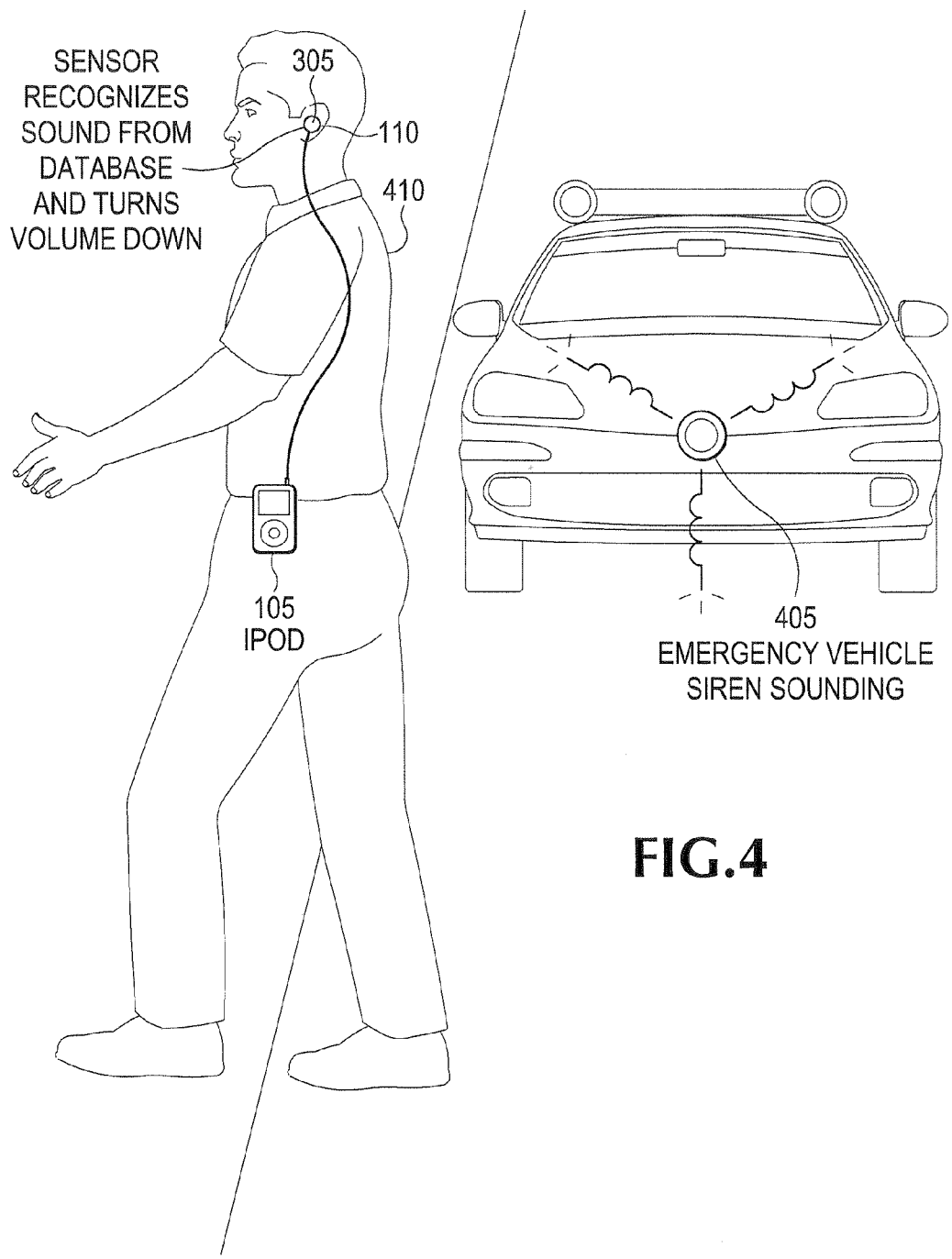
FIG. 4 illustrates a portable device of the present invention reacting to the sensing of siren audio by lowering the volume of the device.

FIG. 4 illustrates the sound of a siren generated by an emergency vehicle 405 in the vicinity of a person 410 utilizing an electronic device 105, such as an iPod, employing an embodiment of the present invention. The sound generated by the vehicle 405 is sensed by the sensors 305 and then may be matched by the audio activation software embedded in the system management/processor 115 in the receivers 110 or audio delivery subsystem (earphones) connected to the iPod 105. The audio activation software may also be embedded in the system management/processor 115 of the iPod 105. A message is then sent to the iPod 105 in the form of an electrical impulse wired into the device 105 or in the form of an RFID signal that corresponds to a command for the device 105 to limit the volume or mute the volume based upon the sound sensed by the system and the settings currently in place on the device 105.

Figure 5:
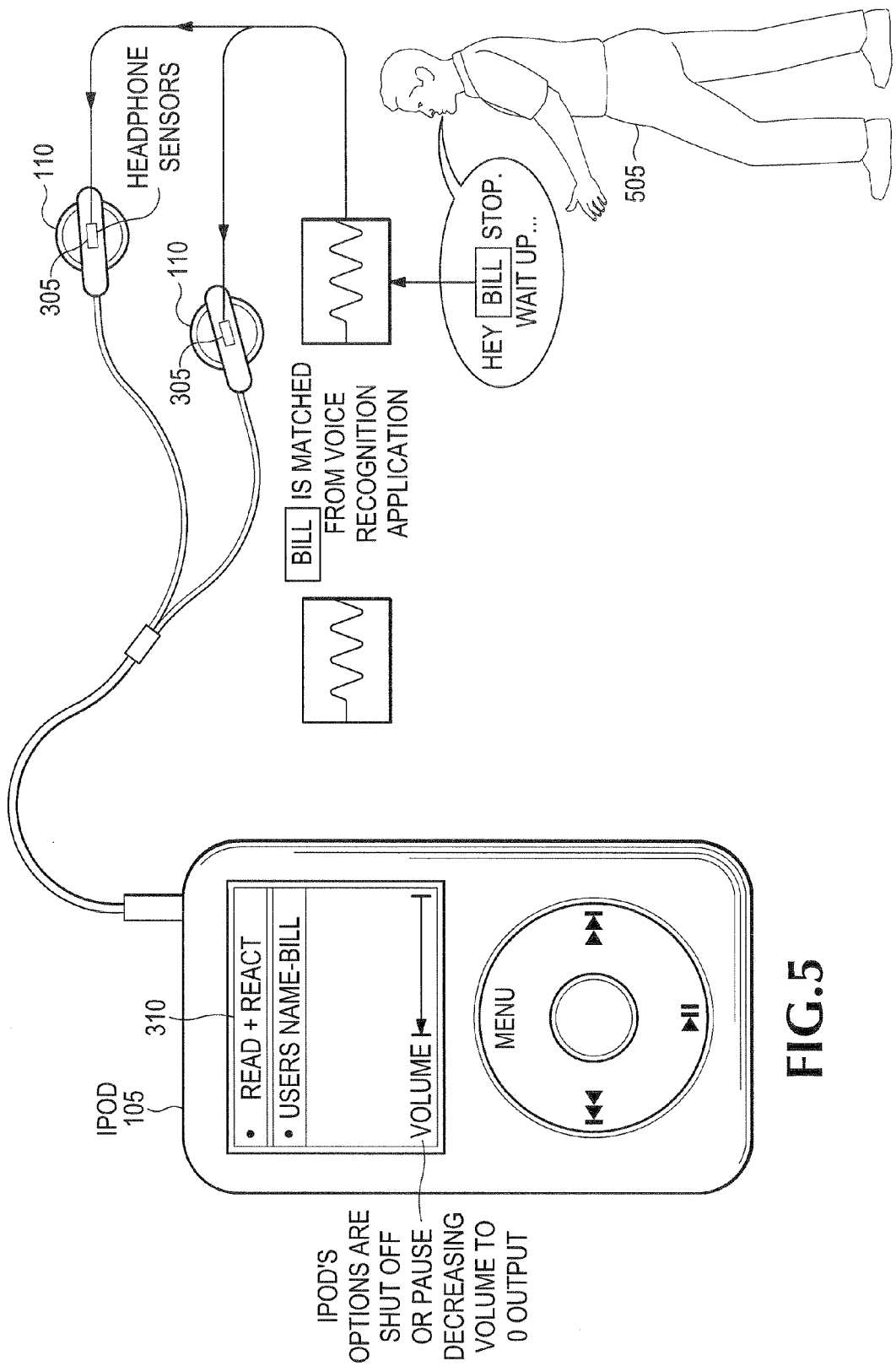
FIG. 5 illustrates how the volume limiter sensing system by the present invention reacts when a user's name is spoken and sensed by the system.

FIG. 5 illustrates an embodiment of the present invention reaching to the sound of a user's name being called by a person 505. The person 505 calls the user's 410 (FIG. 4) name, such as Bill, who is wearing the system 100. The person 505 calls "Bill" within the vicinity of the user 410, Bill. Bill 410 may be utilizing an electronic device 105 connected to receivers 110. The sound generated by the person 505 is sensed by the sensors 305 and then matched by the audio activation software embedded in the system management/processor 115 in the receivers 110. A message is then sent to the iPod 105 in the form of an electrical impulse wired into the device or in the form of an RFID signal from the sensors 305/receivers 110 that corresponds to a command for the device 105 to limit the volume or mute the volume based upon the sound sensed by the system 100 and the settings currently in place on the device 105. The audio match that is generated by the system 100 is displayed on the 'Read and React' menu 310 of Bill's 410 device 105, here being the iPod.

Figure 6:
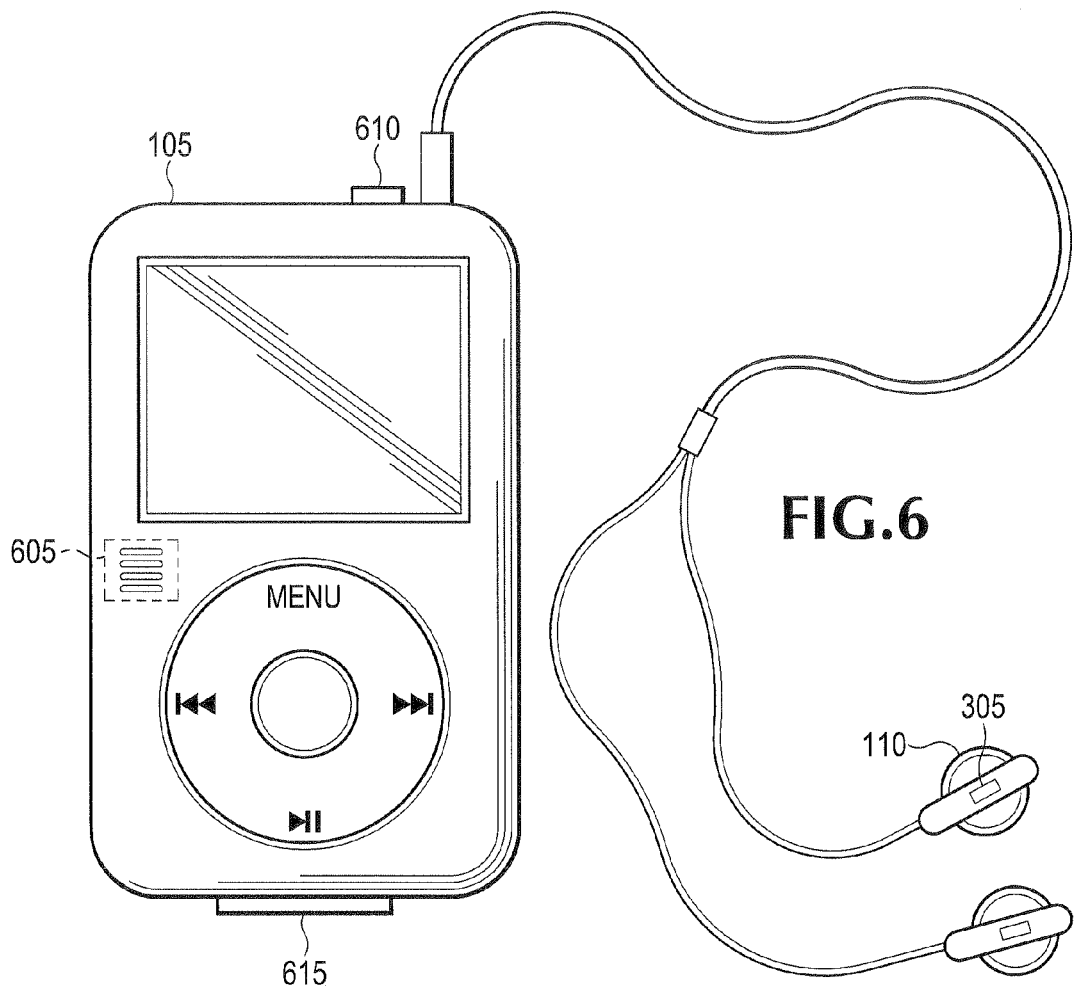
FIG. 6 illustrates two different options by the present invention for placement of audio sensors.

FIG. 6 illustrates a rendering of an electronic device 105 employing an embodiment of the present invention. The electronic device 105 produces audio. The electronic device 105, such as an iPod, is shown with a set of receivers 110, such as earphones, that are equipped with sensors 305 to gather in the audio signals and send them back to the device 105 or match them locally at the sensor 305/receiver 110, for verification of a match. If a match is found, then the device 105 may limit the volume for a certain amount of time based upon default or custom user setting. In FIG. 6, the sounds to which sensor 305 and the invention software are sensitive are built (composed) into the device 105 using a microphone 605 coupled to device 105 as a design altering enhancement. This could also be accomplished by using one of the devices 105 existing ports 610, 615 as a fashioned microphone sensor or audio inputs. The user may increase the number of recognized sounds for matching purposes by recording new sounds into the microphone 605. The new sound may be stored in the storage system 125 in the device 105 or in the receiver 110.

Figure 7:
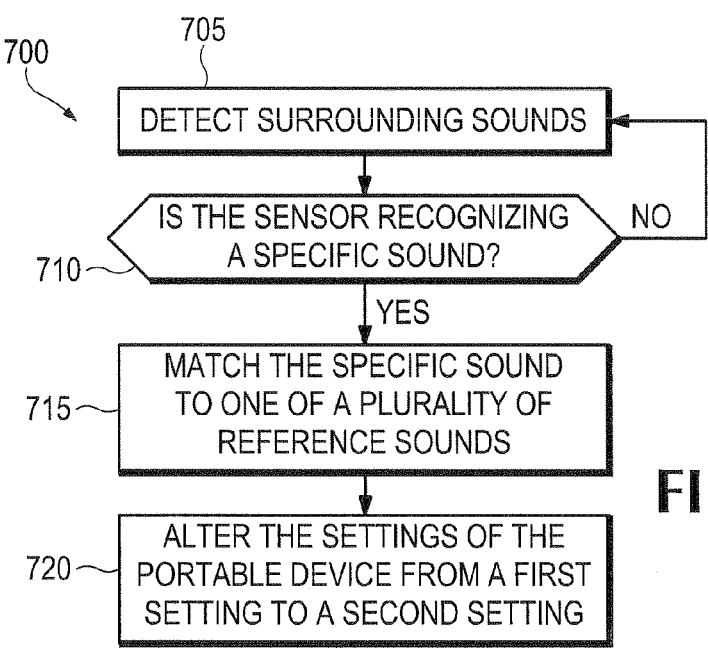
FIG. 7 illustrates a flow chart of the audio recognition and volume limiting system of the present invention.

FIG. 7 illustrates a flow chart 700 of the audio recognition and volume limiting system of the present invention. While a user is wearing the system 100, the system 100 may detects surrounding sound (step 705) in the vicinity of the user 410. The surrounding sound may be any audio sound, including the almost imperceptible sound of a remote control being turned to a specific position, channel or setting such as the method found in http://digitalmedia.oreilly.com/2004/10/28/ipoditunes_hcks.html listed as hack #9. Next, the receiver 110 (sensor 305) determines whether it recognizes a specific sound in the detected surrounding sounds (step 710). If the receiver 110/sensor 305 does not recognize a specific sound, the receiver continues to detect the surrounding sounds at step 705. However, if the receiver 110/sensor 305 does recognize a specific sound, the system matches the specific sound to one of a plurality of reference sounds stored in the storage system at step 715. Once step 715 matches the specific sound with one of the plurality of reference sounds, the system 100 at step 720 causes the electronic device to alter its setting from a first setting to a second setting. The first setting, for example, may be a volume set at a particular volume, while the second setting may be a lower volume than the first setting. As another example, the second setting may be to mute the electronic device or play a specific song, audio piece, message, video or the like.

Figure 8:
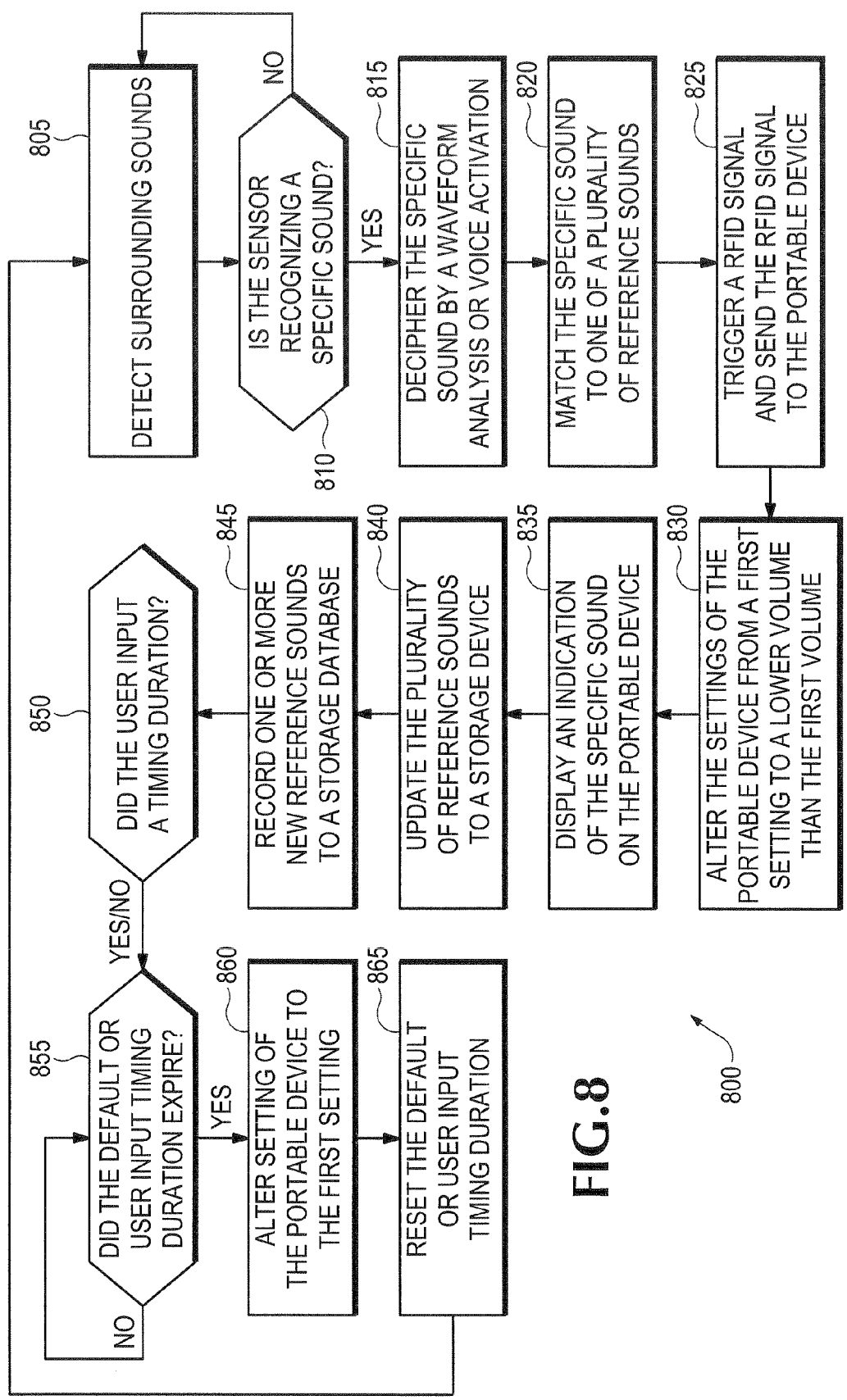
FIG. 8 illustrates a flow chart according to principles of the present invention.

FIG. 8 illustrates another flow chart 800 according to principles of the present invention. The system 100 may detect surrounding sound at step 805 in the vicinity of the system 100. Next, the receiver determines whether it recognizes a specific sound in the surrounding sounds at step 810. If the receiver does not recognize a specific sound, the receiver continues to detect the surrounding sounds at step 805. The system may decipher the specific sound by using matching techniques such as waveform or voice activation at step 815. However, if the receiver does recognize a specific sound, the system matches the specific sound to one of a plurality of reference sounds stored in the storage system at step 820. Once it matches the specific sound with one of the plurality of reference sounds, the system 100 may trigger a RFID signal and send the RFID signal to the portable device for controlling one of the dynamic link library functions to do something else aside from lowering the volume, such as playing a specific song, video, image displayed on the portable device or even raising the volume (step 825). The electronic device may alter its settings from a first setting to a second setting at step 830. The first setting, for example, may be a particular volume, while the second setting may be a lower volume than the first setting. As another example, the second setting may be to mute the electronic device or play a specific song or video. Once the portable device settings are altered, the system 100 at step 835 displays an indication of the specific sound on the portable device, for example, the 'read and react' menu 310 to alert the user to the specific sound. The device may also alert the user to the lowered volume by the use of a beep or other alarm or specific notice sound. The user may also update existing reference sounds stored in the storage system for matching purposes (step 840). The user may also add new reference sounds for matching purposes in the storage system (step 845). At step 850, the system 100 determines whether the user input a timing duration in the portable device. Next, the system 100 determines whether the default or user input timing duration expired at step 855. If the default or user input timing duration did not expire, the system remains at step 855. If the default or user input timing duration did expire, the system 100 alters the settings of the portable device to a third setting (step 860). The third setting, for example, may be the same volume as the first setting or no sound (mute). The system 100 may then reset the default or user input timing duration at step 865 and start detecting the surrounding sounds again at step 805.

Figure 9:
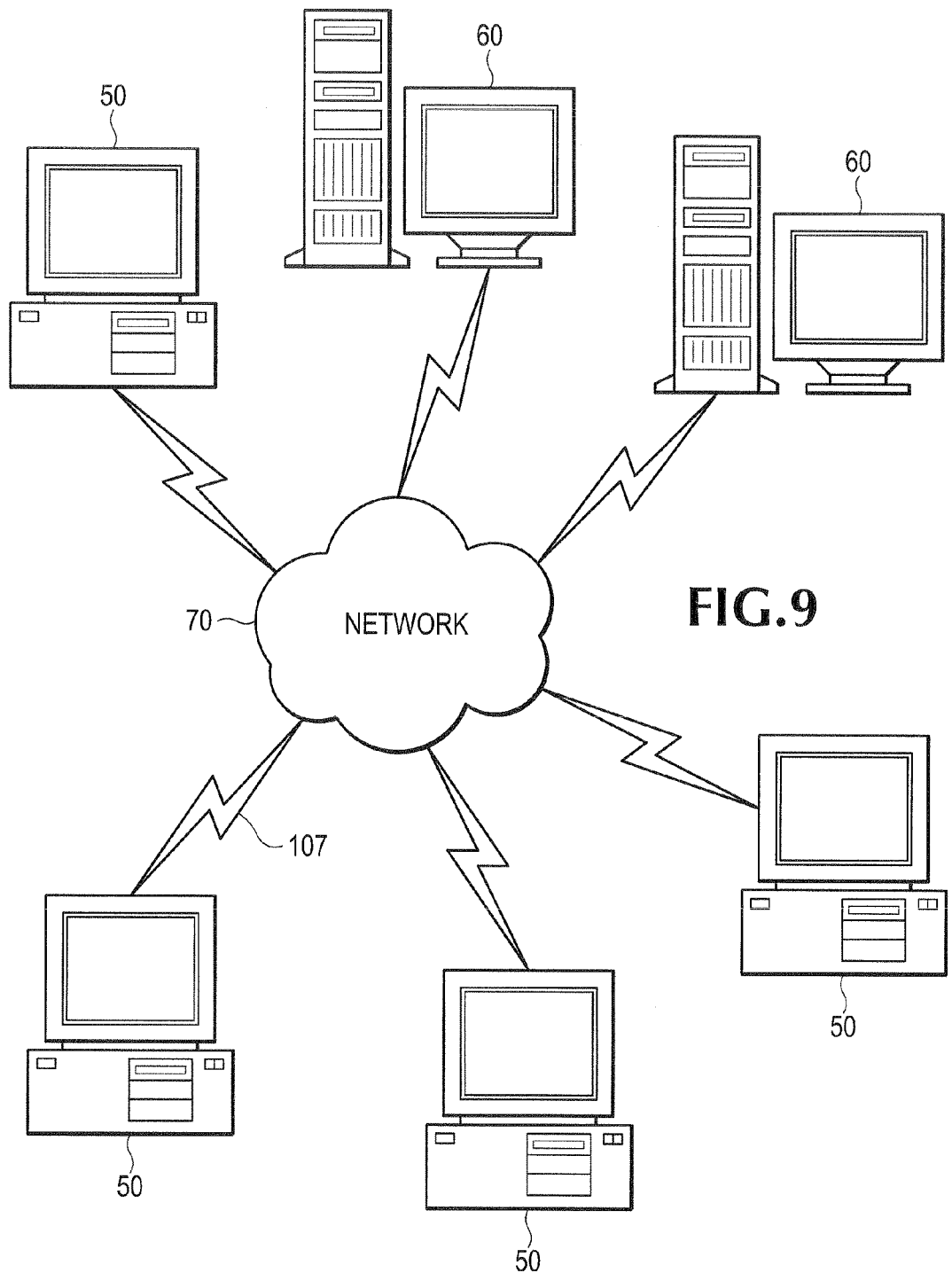
FIG. 9 is a schematic view of a computer environment in which the principles of the preset invention may be implemented.

FIG. 9 illustrates a computer network or similar digital processing environment in which the present invention may be implemented.

Client computer(s)/devices 50 and server computer(s) 60 provide processing, storage, and input/output devices executing application programs and the like. Client computer(s)/devices 50 can also be linked through communications network 70 to other computing devices, including other client devices/processes 50 and server computer(s) 60. Communications network 70 can be part of a remote access network, a global network (e.g., the Internet), a worldwide collection of computers, Local area or Wide area networks, and gateways that currently use respective protocols (TCP/IP, Bluetooth, etc.) to communicate with one another. Other electronic device/computer network architectures are suitable.

Figure 10:
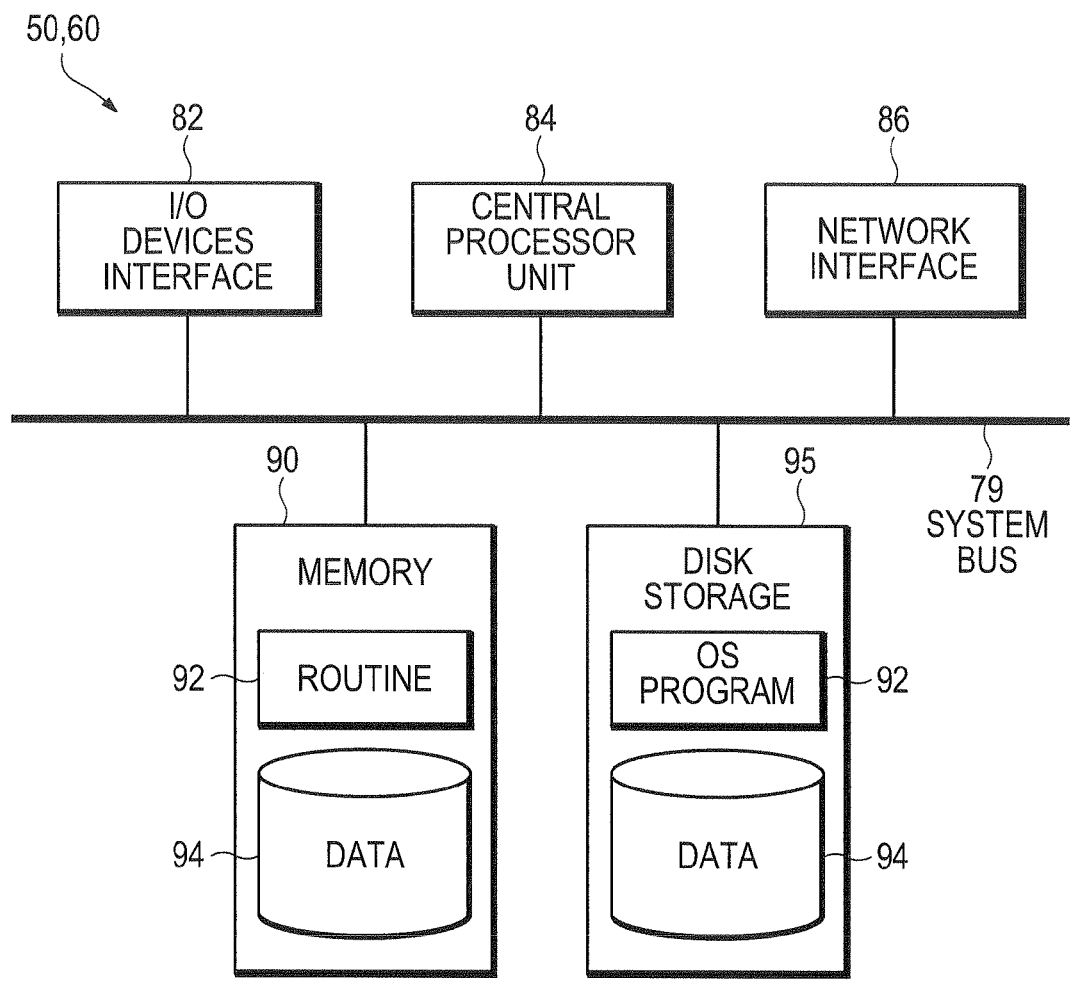
FIG. 10 is a block diagram of the internal structure of a computer from the FIG. 9 computer environment.

FIG. 10 is a diagram of the internal structure of a computer (e.g., client processor/device 50 or server computers 60) in the computer system of FIG. 9. Each computer 50, 60 contains system bus 79, where a bus is a set of hardware lines used for data transfer among the components of a computer or processing system. Bus 79 is essentially a shared conduit that connects different elements of a computer system (e.g., processor, disk storage, memory, input/output ports, network ports, etc.) that enables the transfer of information between the elements. Attached to system bus 79 is I/O device interface 82 for connecting various input and output devices (e.g., keyboard, mouse, displays, printers, speakers, etc.) to the computer 50, 60. Network interface 86 allows the computer to connect to various other devices attached to a network (e.g., network 70 of FIG. 9). Memory 90 provides volatile storage for computer software instructions 92 and data 94 used to implement an embodiment of the present invention (e.g. storage system 125 and system management/processor 115). Disk storage 95 provides non-volatile storage for computer software instructions 92 and data 94 used to implement an embodiment of the present invention. Central processor unit 84 is also attached to system bus 79 and provides for the execution of computer instructions.

In one embodiment, the processor routines 92 and data 94 are a computer program product (generally referenced 92), including a computer readable medium (e.g., a removable storage medium such as one or more DVD-ROM's, CD-ROM's, diskettes, tapes, etc.) that provides at least a portion of the software instructions for the invention system. Computer program product 92 can be installed by any suitable software installation procedure, as is well known in the art. In another embodiment, at least a portion of the software instructions may also be downloaded over a cable, communication and/or wireless connection. In other embodiments, the invention programs are a computer program propagated signal product 107 embodied on a propagated signal on a propagation medium (e.g., a radio wave, an infrared wave, a laser wave, a sound wave, or an electrical wave propagated over a global network such as the Internet, or other network(s)). Such carrier medium or signals provide at least a portion of the software instructions for the present invention routines/program 92.

In alternate embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer. In another embodiment, the computer readable medium of computer program product 92 is a propagation medium that the computer system 50 may receive and read, such as by receiving the propagation medium and identifying a propagated signal embodied in the propagation medium, as described above for computer program propagated signal product.

Generally speaking, the term "carrier medium" or transient carrier encompasses the foregoing transient signals, propagated signals, propagated medium, storage medium and the like.

Further, the present invention may be implemented in a variety of computer architectures. The computer network of FIGS. 9 and 10 are for purposes of illustration and not limitation of the present invention.

While this invention has been particularly shown and described with references to preferred embodiments thereof, it will be understood by those skilled in the art that various changes in form and details may be made therein without departing from the scope of the invention encompassed by the appended claims. For example, the foregoing description of system responses (e.g., volume control, muting, song change, audio/visual indicators, etc.) to sensor detecting surrounding sounds is by way of illustration and not limitation. It is understood that the invention system may respond with a respective different setting for different detected surrounding sounds (muting in response to detected emergency alarm/siren, decreasing volume in response to detected human or animal noise, etc.). Further the invention system may utilize any combination of volume control, audio change and visual indication per setting change in response to detected surrounding sounds. The combination in some embodiments may be in series or in parallel or the like.

What is claimed is:

1. A method, comprising:
   monitoring surrounding sounds by at least one sensor communicatively connected to a portable media player, wherein the portable media player is configured to play content;
   recognizing a specific sound among the surrounding sounds by matching the specific sound to at least one of a plurality of reference sounds stored on a local database;
   causing an identity of the specific sound to be displayed on the portable media player in response to monitoring the surrounding sounds and recognizing that the specific sound matches the at least one of the plurality of reference sounds in the local database;
   triggering a radio frequency identification (RFID) signal; and
   sending the RFID signal from the at least one sensor to the portable media player to alter settings of the portable media player while the portable media player is playing the audio content from a first setting to a second setting, in response to the specific sound matching the at least one of the plurality of reference sounds.

2. The method according to claim 1, wherein recognizing the specific sound further comprises:
   deciphering the specific sound by a waveform analysis or voice activation.

3. The method according to claim 1, further comprising:
   recording one or more new reference sounds to the local database;
   updating the plurality of reference sounds in the local database with the one or more new reference sounds; and
   displaying an identity of the one or more new reference sounds when the specific sound is matched to the local database.

4. The method according to claim 1, wherein the identity of the specific sound is displayed in textual or graphical format on the portable media player.

5. The method according to claim 1, wherein altering the settings of the portable media player comprises adjusting a volume control, muting the volume, or playing another sound.

6. The method according to claim 5, wherein altering the settings of the portable media player comprises calling a dynamic link library (DLL).

7. The method according to claim 1, wherein the surrounding sounds are continuously monitored by the at least one sensor while the audio content is played, and wherein the identity of the specific sound is automatically displayed on the portable media player in response to the specific sound matching the at least one of the plurality of reference sounds in the local database.

8. The method according to claim 3, wherein the identity of the specific sound is no longer displayed after a predetermined amount of time, and wherein the predetermined amount of time is adjustable on the portable media player.

9. A portable media device, comprising:
   at least one sensor connected to the portable media device, wherein the portable media device is configured to play audio associated content, and wherein the at least one sensor is configured to sense surrounding sounds;
   a local database located in the portable media device configured to store a plurality of reference sounds;
   a processor configured to:
     receive a radio frequency identification (RFID) signal comprising the surrounding sounds;
     detect a specific sound from the RFID signal by matching the specific sound to at least one of the plurality of reference sounds; and
     alter settings of the portable media device from a first setting to a second setting while the portable media device is playing the audio content, wherein the settings are altered in response to the specific sound matching the at least one of the plurality of reference sounds; and a display unit configured to display an identity of the specific sound in textual or graphic form on the portable media device in response to the specific sound matching the at least one of the plurality of reference sounds in the local database, wherein the identify of the specific sound is displayed while the portable media device is playing the audio content.

10. The portable media device according to claim 9, wherein the portable media player comprises a digital music player.

11. The method according to claim 1, wherein the specific sound is recognized by the at least one sensor while the portable media player is playing the audio content.

12. The method according to claim 5, wherein the another sound comprises an alarm.

13. The portable media device according to claim 9, wherein the at least one sensor comprises an earphone.

14. The portable media device according to claim 9, wherein the processor is further configured to decipher the specific sound by a waveform analysis or voice activation.

15. The portable media device according to claim 9, wherein the processor is further configured to: alter the settings of the portable media player from the second setting to a third setting after a predetermined amount of time.

16. The portable media device according to claim 9, further comprising:
    a storage system to store the plurality of reference sounds; and
    a device recorder to record one or more new reference sounds to the storage system.

17. The portable media device according to claim 9, wherein the processor is configured to alter the settings of the portable media player including adjusting a volume control, muting the volume, or playing another sound.

18. The portable media device according to claim 9, wherein the identity of the specific sound is automatically displayed on the portable media player in response to the specific sound matching the at least one of the plurality of reference sounds in the local database.

19. The portable media device according to claim 9, wherein the device is configured to add a new reference sound to the local database and to associate the new reference sound with a corresponding identity.

20. A non-transitory computer-readable medium having stored thereon computer-executable instructions, wherein the instructions are executable by a computing device to cause the computing device to perform operations comprising:

storing a plurality of reference sounds on a local database;
monitoring surrounding sounds while a portable media player is reproducing audio content;
recognizing a specific sound among the surrounding sounds by matching the specific sound to at least one of the plurality of reference sounds;
causing an identity of the specific sound to be displayed on the portable media player in response to the specific sound matching the at least one of the plurality of reference sounds in the local database while the portable media player is reproducing the audio content;
triggering a radio frequency identification (RFID) signal; and
sending the RFID signal to the portable media player to alter settings of the portable media player while the portable media player is reproducing the audio content from a first setting to a second setting, wherein the settings of the portable media player are altered when the specific sound matches the at least one of the plurality of reference sounds.

21. The non-transitory computer-readable medium according to claim 20, wherein the non-transitory computer-readable medium comprises any of a CD-ROM, floppy disk, tape, flash memory, system memory, or a hard drive.

22. The non-transitory computer-readable medium according to claim 20, wherein altering the settings of the portable media player includes playing a specific song associated with the specific sound.

23. The non-transitory computer-readable medium according to claim 20, wherein altering the settings of the portable media player includes playing a specific video associated with the specific sound.

24. The non-transitory computer-readable medium according to claim 20, wherein altering the settings of the portable media player includes increasing a volume of the audio content being played on the portable media player, and wherein the second setting corresponds to a higher volume than the first setting.

25. The non-transitory computer-readable medium according to claim 20, wherein the specific sound is recognized responsive to monitoring the surrounding sounds while the portable media player is reproducing the audio content.

26. The non-transitory computer-readable medium according to claim 20, wherein the operations further comprise:
    updating the plurality of reference sounds in the local database with one or more new reference sounds; and displaying an identity of the one or more new reference sounds when the specific sound is matched to the local database.

* * * * *

UNITED STATES PATENT AND TRADEMARK OFFICE
CERTIFICATE OF CORRECTION

| | | |
|---|---|---|
| PATENT NO. | : 7,884,714 B2 | Page 1 of 1 |
| APPLICATION NO. | : 11/620352 | |
| DATED | : February 8, 2011 | |
| INVENTOR(S) | : Fein et al. | |

It is certified that error appears in the above-identified patent and that said Letters Patent is hereby corrected as shown below:

Column 7, line 67, in Claim 1, delete "content;" and insert -- audio content; --.

Column 8, line 55, in Claim 9, after "audio" delete "associated".

Column 9, line 8, in Claim 9, delete "identify" and insert -- identity --.

Signed and Sealed this
Fifth Day of July, 2011

David J. Kappos
*Director of the United States Patent and Trademark Office*